United States Patent [19]
Yamasaki et al.

[11] Patent Number: 5,805,521
[45] Date of Patent: Sep. 8, 1998

[54] DRAM MEMORY SYSTEM

[75] Inventors: Noritoshi Yamasaki, Kusatsu; Hisatada Miyatake, Ohtsu, both of Japan

[73] Assignee: International Business Machines Corporation, Armonk, N.Y.

[21] Appl. No.: 773,150

[22] Filed: Dec. 26, 1996

[30] Foreign Application Priority Data

Feb. 5, 1996 [JP] Japan ................................. 8-018930

[51] Int. Cl.⁶ .................................................. G11C 8/00
[52] U.S. Cl. ............................... 365/230.03; 365/230.06; 365/238.5
[58] Field of Search ..................... 365/230.03, 230.06, 365/238.5

[56] References Cited

U.S. PATENT DOCUMENTS

| | | | |
|---|---|---|---|
| 5,487,050 | 1/1996 | Kim et al. ........................... | 365/230.06 |
| 5,513,139 | 4/1996 | Butler ............................... | 365/230.06 X |
| 5,574,880 | 11/1996 | Shaw ............................... | 365/230.06 X |
| 5,586,080 | 12/1996 | Raad et al. ........................ | 365/230.06 |
| 5,610,874 | 3/1997 | Park et al. ....................... | 653/230.06 X |

Primary Examiner—Do Hyun Yoo
Attorney, Agent, or Firm—Robert A. Walsh

[57] ABSTRACT

A DRAM system having two data stored in continuous addresses that are fetched to improve the data transfer rate in a memory system. An output signal indicating shift up or shift down is added to a predecoder to supply to a decoder. The decoder receives this signal, and enables it to access a block higher or lower than a block corresponding to an address designated by the input address. Specifically, a line is arranged to a block adjacent to one block so that this line can be activated by a shift-up signal or the like.

8 Claims, 4 Drawing Sheets

DRAM MEMORY SYSTEM

DETAILED DESCRIPTION OF THE INVENTION

1. Field of the Invention

The subject invention relates to a system for predecoding and decoding a column address of a DRAM system.

2. Background Art

A DRAM memory system is widely used because a DRAM cell has simple structure, consumes a small area and can be manufactured at low cost. As shown in FIG. 1, a DRAM system (a memory system using DRAM cells) comprises a DRAM cell array 1 (memory array constituted by DRAM cells) which is a region for storing information, and an address decoder for accessing a designated address. The DRAM array 1 is formed in a matrix in which DRAM cells are arranged in a grid. A specific DRAM cell 4 is identified by an address allocated to a row and a column of the matrix. The address is externally supplied from a CPU or the like as an input address 10 of a bit string with predetermined number of bits, and divided into bit strings with predetermined number of bits, respectively, for a row predecoder 11 and a column predecoder 12. For example, the input address 10 is 16 bit long 11 bits of which are input into the row predecoder 11, and the remaining bits of which are input into the column predecoder 12. However, it varies depending on the structure of the DRAM array 1.

Parts of the respective addresses supplied to the row predecoder 11 and the column predecoder 12 are decoded (predecoded). Then, the predecoded addresses are supplied to a row decoder 2 and a column decoder 3 directly connected to the DRAM array 1, respectively, where they are decoded to generate a final address. A desired bit 4 is accessed from a desired address in the DRAM array 1 with the generated address. It is well known in the art relating to a DRAM that the input address is thus decoded in several steps.

FIG. 2 shows detail of the column predecoder 12. In the figure, the column predecoder 12 is input with five-bit signals from AC0–AC4 of a bit string relating to the input address 10. These signals are predecoded by predecoder means 13, 14, and 15. For example, AC0 and AC1 are converted to any one output of BY0–BY3 by the predecoder means 13. AC2 and AC3 are also converted to any one output of BY4–BY7 by the predecoder means 14, and AC4 is also converted to either one of BY8 or BY9 by the predecoder means 15.

FIG. 3 shows detail of the column decoder 3. Any one of 32 bit lines is selected by three outputs of any one output of BY0–BY3 (corresponding to AC0 and AC1 of the input address), any one output of BY4–BY7 (corresponding to AC2 and AC3 of the input address), and either one output of BY8 or BY9 (corresponding to AC4 of the input address).

For example, it is assumed that the input address AC4–AC0 is a bit string (01011). Referring to FIG. 2, BY8 is output since AC4 is 0. Since the combination of AC3 and AC2 is (10), BY6 is output. Since the combination of AC1 and AC0 is (11), BY3 is output. Output of this combination (BY8, BY6, BY3) activates corresponding contacts 15, 16, and 17, respectively, so that a bit line addressed as (11) is selected. In FIG. 3, a bit line pair when the bit corresponding to AC4 is 1 (BY9 being output) is omitted.

While the column address is generated by the above procedure, recently, a scheme is frequently used in the DRAM system, which inputs or outputs data in a burst mode. The burst mode means a mode in which data relating to a plurality of continuous column addresses are continuously input or output every clock cycle. This mode is frequently used as a scheme for complementing low operating speed which the DRAM inherently has because this mode allows input and output at a high speed for a case of image data in which data is stored in continuous physical addresses.

The predecessor to the burst mode is a mode called nibble mode. The nibble mode burst outputs four bits stored in continuous column addresses. In this scheme, the circuit is configured in such a manner that the addresses vary as the electric potential of CAS is increased or decreased (cycled). Then, a normal accessing method is used for one bit first accessed (and, therefore, requiring a relatively long period of time), and succeeding three bits are continuously burst output by cycling CAS. Although this scheme allows burst output at a high speed, since higher bits in the input address are fixed, addressing merely cycles in addresses in a unit of four bits. In other words, burst input/output cannot be performed across bit line groups. For example, taking FIG. 3 into account, bit lines are grouped into four-bit lines each by AC0 and AC1 which are lower two bits of input address bits. One of these bit line groups is called a block in the following. The burst input/output according to the background art cannot be performed across a plurality of blocks. That is, in the above example, if a bit line "11" is selected, access cannot be performed for a bit line "12" belonging to the next block. Therefore, a burst output is cyclically performed in one block in a sequence of 11=>8=>9=>10 (number of bit lines). That is, in the nibble mode, it can be said that only connections from BY0 to BY3 is performed one after another by the cycling of CAS.

The burst mode is an improvement of the nibble mode. Unlike the nibble mode, the burst mode can access addresses in the cycle in various sequence. To perform continuous burst input/output, it is necessary to select the bit lines continuously arranged by clock cycle. Doing this becomes difficult if addresses are externally input every time. Accordingly, a technology has been developed that, when an address is first input, for example, succeeding inputs are automatically generated within a DRAM system to allow continuous burst input/output. In this technology, for example, an address counter is prepared in a DRAM to detect at which number of access that access is made in the burst mode. Then, an address is generated at timing synchronizing an external clock according to the number of access detected by the address counter. However, even in the presently known burst mode, output cannot be performed across blocks.

As described, the background art has a disadvantage that the burst output cannot be performed across blocks. This adversely affects in increasing the speed in that, if it is desired, for example, in FIG. 3 to continuously output data relating to bit lines 6, 7, 8, and 9, it is necessary to perform burst output two times, and to discard data relating to unnecessary bit lines 4, 5, 10, and 11.

To output data across blocks, the conventional scheme is necessary to vary input address bits other than lower two bits which vary in burst transfer. However, to do this, it is necessary to interrupt burst output. This requires time for new CAS, which prevents improvement of speed.

In addition, in the conventional scheme, only one address can be designated when one input address is input. However, it is clear that, if a plurality of addresses can be simultaneously designated, it contributes to improve the speed.

SUMMARY OF THE INVENTION

The present invention is intended to provide an addressing system which allows selection of any continuous column addresses across blocks.

The present invention is also intended to provide an addressing system for DRAM which enables it to designate two or more addresses with one input address, and to fetch two or more data in one cycle.

To solve the problems mentioned above, it is necessary to employ a predecoder circuit according to the present invention. The predecoder circuit is utilized in an environment where a plurality of address lines are divided into blocks consisting of a predetermined number of address lines. These blocks are defined by a higher bit string of bit string relating to the input address. It is an object of the invention to simultaneously select a first address line and a second address line from the address lines contained in the address line group defined by the higher bit of bit string by the lower bit string relating to the input address. The predecoder circuit according to the present invention comprises at least numbered output lines in the number corresponding to the number of bits in the lower bit string of an input address input therein, and a designating input for designating the relationship, which is either larger or smaller, between a first address corresponding to the first address line to be selected and a second address corresponding to the second address line. The operation of the predecoder circuit according to the present invention is divided into the following occasions:

(1) When the designating input designates that the second address corresponding to the second address line is larger than the first address corresponding to the first address line, and if the first address is the largest in one group, the first output line having the largest numbering, the second output having the smallest numbering, and a shift-up signal line shifting up to an adjacent group higher than the group defined by the higher bit in the input address are activated.

(2) Otherwise, that is, when the designating input designates that the second address corresponding to the second address line is larger than the first address corresponding to the first address line, and if the first address is not the largest in the group, the first output line and the second line continuing the numbering corresponding to the first output line and having a larger numbering are activated.

When the designating input designates that the second address corresponding to the second address line is smaller than the first address corresponding to the first address line, it can be considered to be similar to the above. Actually, when the designating input designates that the second address is smaller than the first address, it is preferable that corresponding signals are activated, and other signals in complementary relationship to these signals are provided. This will be described in detail for the embodiment in the following.

To attain the object of the present invention, a decoder circuit is required to be connected between the predecoder circuit and the DRAM array. The decoder circuit is to simultaneously select a first address line and a second address line adjacent to the first address line and having a larger numbering than it from the address line group divided into a plurality of groups by a lower bit string relating to the input address. The decoder circuit according to the present invention comprises a plurality of input lines to which signal lines output by a predecoder circuit are input, a first input line for inputting a signal indicating shift-up, a second input line complementary to the first input line, and a plurality of address lines. Then, the decoder circuit according to the present invention selects, when a first address corresponding to the first address line is the largest in its group, selects a second address line corresponding to the smallest address in a higher group adjacent to that group. Thus, it is characterized in that a line extends from the original group to the adjacent higher group, and activated by the first input line indicating shift-up.

It is similar to constitute a decoder circuit that simultaneously selects a first address line and a second address line adjacent to the first address line and having a smaller address than it.

BRIEF DESCRIPTION OF THE DRAWINGS

The present invention is illustrated by way of example and not limited in the figures of the accompanying drawings in which like references indicate similar elements; and in which.

PREFERRED EMBODIMENT

Figure 1:
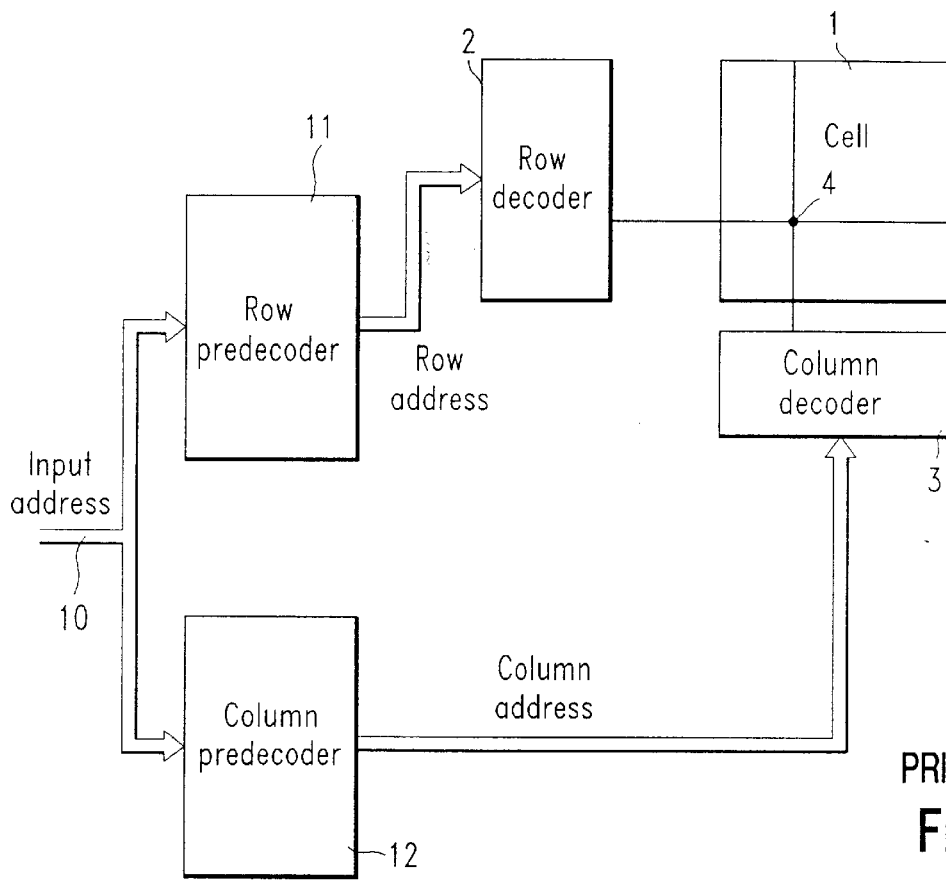
FIG. 1 is a block diagram of a DRAM system.
Figure 2:
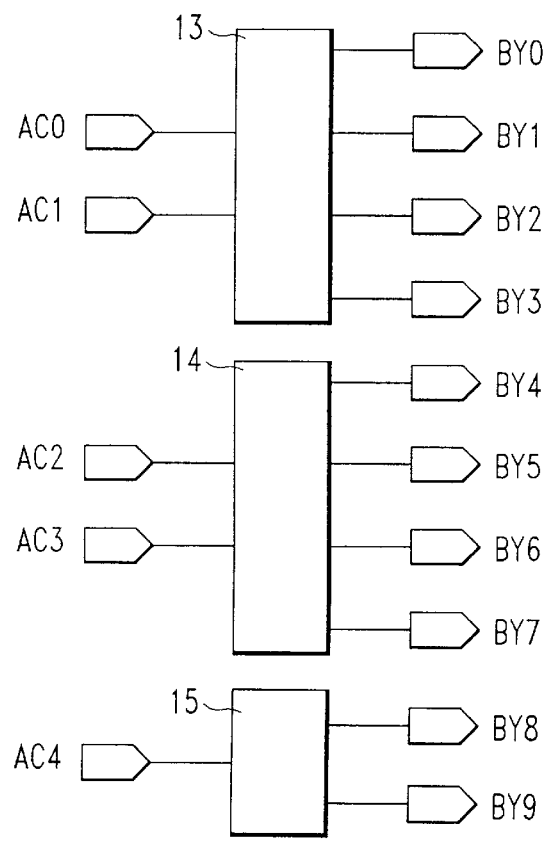
FIG. 2 is a diagram illustrating the operation of a predecoder according to the background art.
Figure 4:
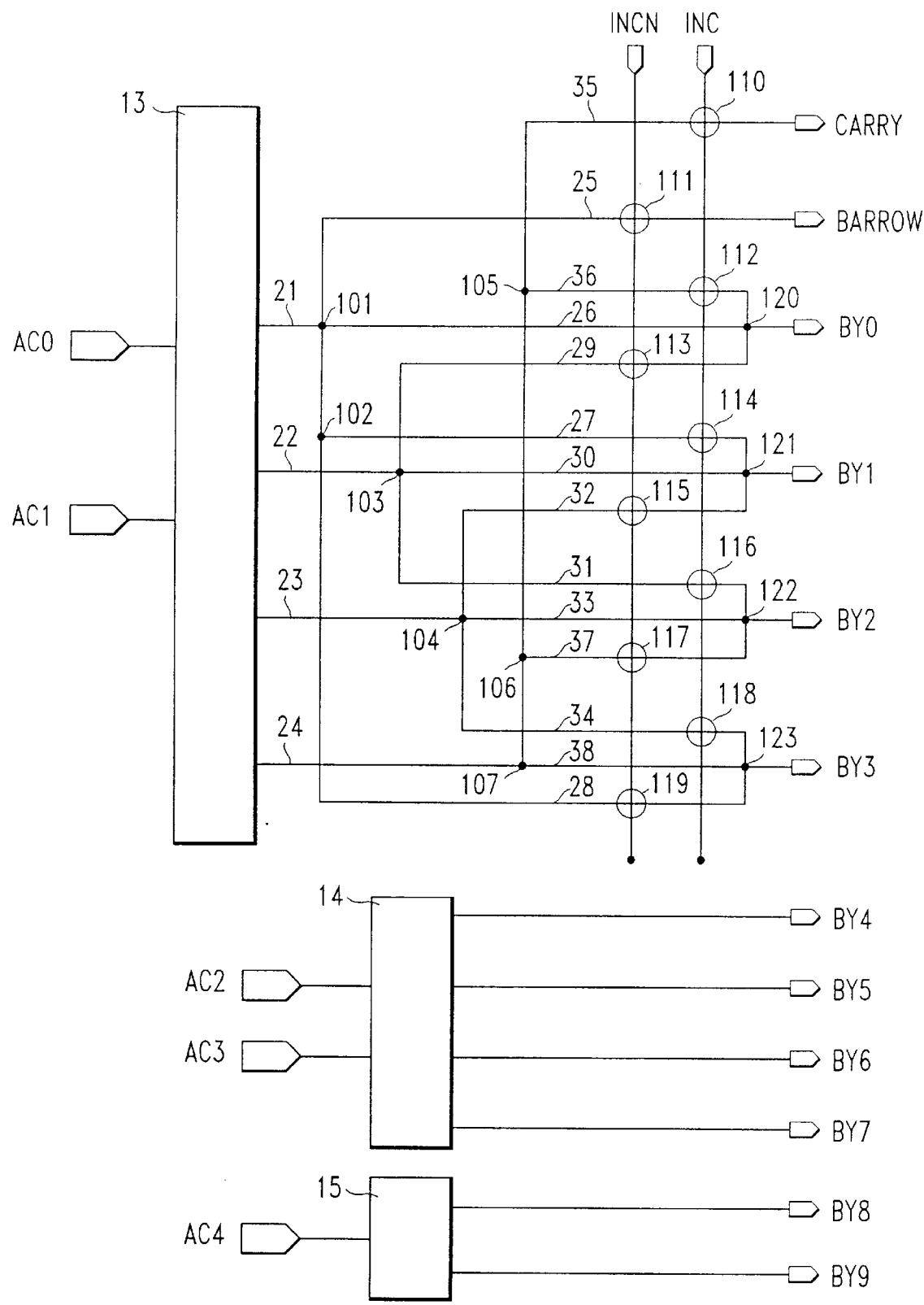
FIG. 4 is a diagram illustrating the operation of a predecoder according to the subject invention.

A description of the predecoder according to the present invention is shown in FIG. 4. Differences from the predecoder according to the background art as shown in FIG. 2 lie in that INC and INCN signals are input into the predecoder means 13 corresponding to AC0 and AC1 which are bit strings relating to lower two bits of the input address, that CARRY and BORROW signals are output, and a new arrangement of connection between lines due to introduction of these new signals.

Here, INC and INCN have values complement to each other. That is, if the former is higher, the latter is lower, or vice versa. In this case, when INC is higher, it indicates that an address relating to the address being input is incremented by one in designating two bit lines. In addition, when INC is lower, INCN is higher, and it indicates that an address relating to the address being input is decremented by one in designating two bit lines. INC and INCN are designated by a user input. In addition, CARRY is an output signal for selecting a bit line from a higher block adjacent to the block defined by the input address, while BORROW is an output signal for selecting a bit line from a lower block adjacent to the block defined by the input address. In addition, contact points the line passing are indicated by a symbol · or ○.

The operation is described in detail in the following. It is considered as the first case that (AC1, AC0)=(0, 0) and INC=high. In view that the object of the present invention is to simultaneously select two adjacent lines, in the condition that INC is high it is the same as to simultaneously designate (AC1, AC0)=(0, 0) and (0, 1), so that BY0 and BY1 should be output. How this is implemented is described by referring to the circuit of FIG. 4. First, a line 21 is selected by the predecoder means 13. Selection of the line 21 causes lines 25, 26, 27, and 28 connected to contacts 101 and 102 to conduct. The lines 25 and 28 among them are connected to INCN, and shut down by contacts 111 and 119, respectively, because INCN is lower when INC is higher. On the other hand, the line 26 is connected to BY0 through a contact 120. Accordingly, the first output becomes BY0 as per the input address. As for the line 27, a contact 114 with INC is conductive because INC is higher. Accordingly, the line 27 is connected to BY1 (input address +1) through contacts 114 and 121. Thus, the predecoder according to the present invention simultaneously outputs an output as per the input address and an output of the input address +1 with one input address.

Now, it is considered as the second case that (AC1, AC0)=(0, 1) and INC=high. In this case, it is the same as to simultaneously designate (AC1, AC0)=(0, 1) and (1, 0), so that BY1 and BY2 should be designated. This is verified by referring to the circuit of FIG. 4. First, designation of (AC1, AC0)=(0, 1) causes a line 22 to be selected and connected to lines 29, 30, and 31 through a contact 103. The line 29 is shut down by a contact 113 because it is not connected to INC, and INCN=low. The line 30 outputs BY1 as the first output through a contact 121 as it is, which is a result as per the input address. Then, the line 31 is connected to BY2 (input address +1) through the contact 122 because the contact 116 connected to INC is activated (due to INC=high). In this case also, the predecoder according to the present invention simultaneously outputs an output as per the input address and an output of the input address +1 with one input address.

It is considered as the third case that (AC1, AC0)=(1, 0) and INC=high. In this case, similarly, the line 23 is selected, and its first output becomes BY2 (as per the input address) through the contact 104, the line 33, and the contact 122, while its second output becomes BY3 through the contact 104, the line 34, the contact 118, and the contact 123.

It is considered as the fourth case that INCN=high. For example, when (AC1, AC0)=(1, 0) and INCN=high, since it is the same as to simultaneously designate (AC0, AC1)=(1, 0) and (0, 1), the output should be BY2 and BY1. In this case, the line 23 is selected, and connected to the lines 32, 33, and 34 through the contact 104. The line 33 outputs BY2 (as per the input address) through the contact 122. The line 34 is shut down because it is not connected to INCN, and only the line 33 outputs BY1 (input address −1) through the contact 115 connected to INCN and the contact 121. Here, the predecoder according to the present invention can simultaneously output an output as per the input address and an output of the input address −1 with one input address.

As described above, the predecoder according to the present invention can simultaneously output adjacent two of outputs of BY0–BY3 in the same block.

Then, it is considered as the fifth case that an address and INC out of a range of the same block are designated. For example, a case where (AC1, AC0)=(1, 1), and INC=high is considered. In this case, although the first output as per the input address should be BY3 of the designated block, the second output should be BY0 of an adjacent higher block. In this case, the line 24 is first selected. The line 24 is connected to the lines 35, 36, 37, and 38 through the contact 107. Among them, since the line 37 is shut down at the contact 117 because it is not connected to INC. The line 38 outputs BY3 as the first output through the contact 123 (as per the input address). Then, the lines 35 and 36 output CARRY and Y0 through the contacts 110 and 112, and through the contact 120, respectively, because both of them are connected to INC. Simultaneous output of CARRY and Y0 is the second output at the time of predecoding. As will be described later, CARRY is an output signal designating an adjacent higher block, and the second output consequently designates BY0 of the adjacent higher block. Thus, even if the input address is across a plurality of blocks, the predecoder according to the present invention simultaneously outputs an output as per the input address and an output of the input address +1 (actually, an address contained in the adjacent higher block) with one input address. This is because CARRY for shifting up to the adjacent higher block is simultaneously output together with the second output.

It is considered as the sixth case that an address and INCN out of the range of the same block are designated. For example, a case where (AC1, AC0)=(0, 0) and INCN=high is considered. In this case, while the first output as per the input address should be BY0 of the designated block, the second output should be BY3 of an adjacent lower block. In this case, the line 21 is first selected. The line 21 is connected to the lines 25, 26, 27, and 28 through the contacts 101 and 102. Among them, the line 27 is shut down because it is not connected to INCN. Then the line 26 outputs BY0 as the first output through the contact 120 (as per the input address). In addition, the lines 25 and 26 are connected to INCN through the contacts 111 and 119, and output BORROW and BY3 as the second output through the contact 123, respectively. Therefore, in this case also, the second output becomes simultaneous output of BORROW and BY3. As will be described later, BORROW is an output signal designating an adjacent lower block, and the second output consequently designates BY3 of the adjacent lower block. Thus, in this case also, even if the input address is across a plurality of blocks, the predecoder according to the present invention simultaneously outputs an output as per the input address and an output of the input address −1 (actually, an address contained in the adjacent lower block) with one input address. This is because BORROW for shifting down to the adjacent lower block is simultaneously output together with the second output.

Figure 3:
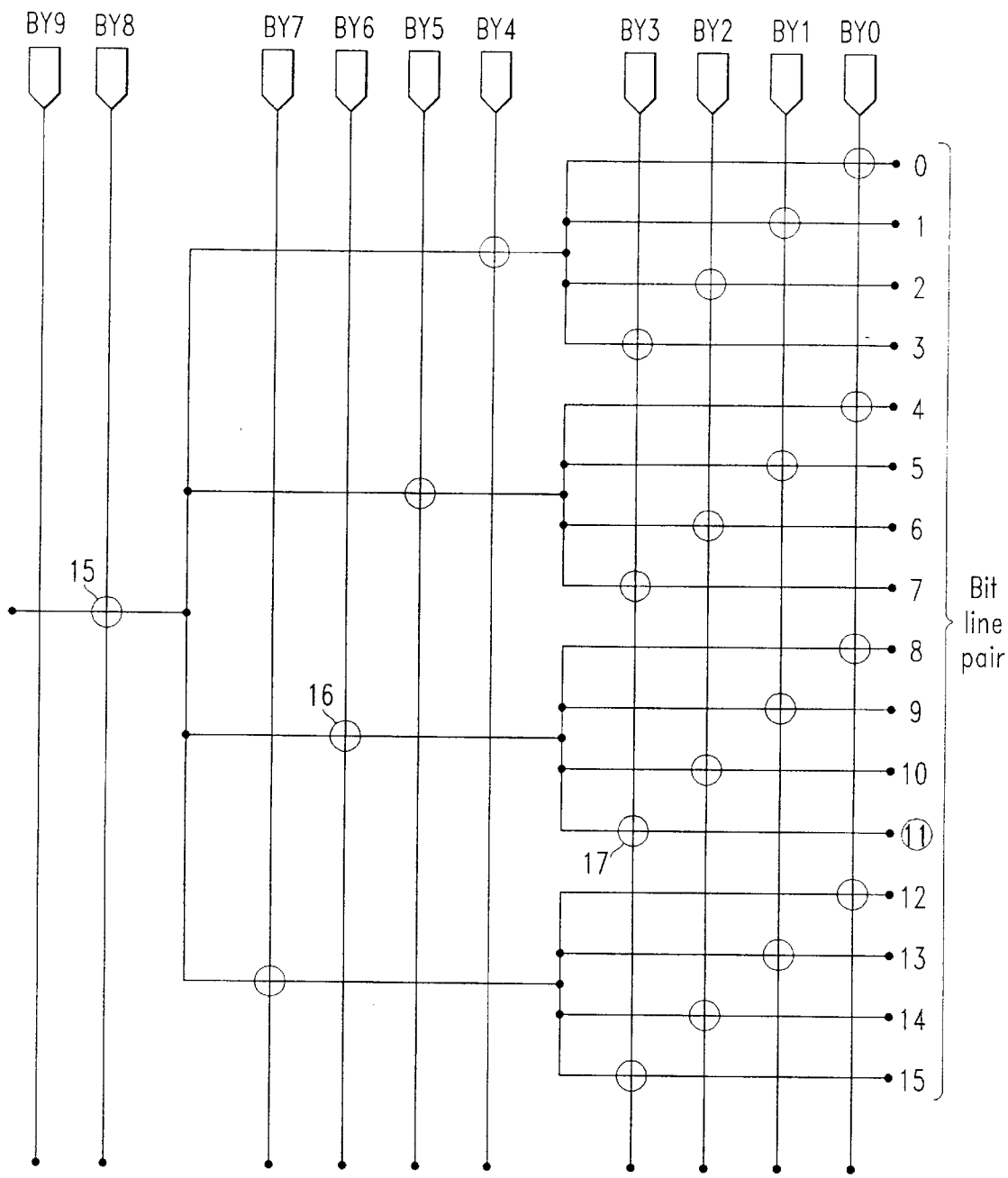
FIG. 3 is a diagram illustrating the operation of a decoder according to the background art.
Figure 5:
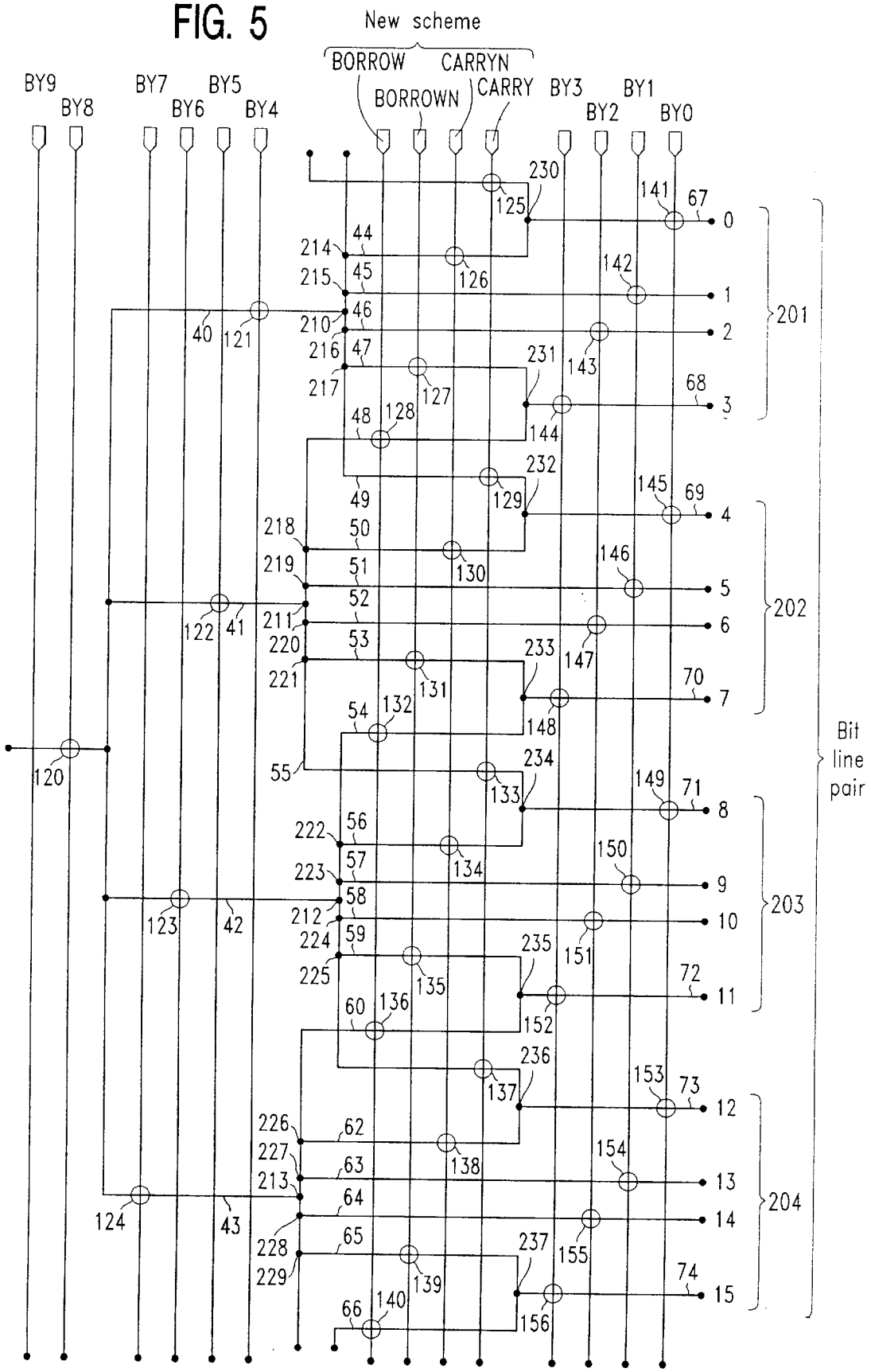
FIG. 5 is a diagram illustrating the operation of a decoder according to the subject invention.

FIG. 5 shows a column decoder according to the present invention. The column decoder corresponds to the output of the predecoder shown in FIG. 4. In other words, the column decoder according to the present invention differs from that according to the background art as shown in FIG. 3 in that the output signals CARRY, CARRYN, BORROW, and BORROWN from the predecoder are input into the decoder, and that arrangement of connection between these input signals and respective bit lines are novel. Here, CARRY and CARRYN, and BORROW and BORROWN are complementary to each other. Accordingly, if the former is higher, the latter automatically outputs a lower signal, and vice versa.

It is assumed that the higher bits (AC4, AC3, AC2)=(0, 0, 1). Under this assumption, the operation of the decoder according to the present invention is described in detail referring to FIG. 5 by utilizing several ones of the above-mentioned cases.

A case where the input conditions of the predecoder are the first case described above is considered. That is, if the input conditions for the decoder are (AC1, AC0)=(0, 0), and INC=high, inputs to the decoder are BY0, BY1, CARRYN=high, and BORROWN=high (since both CARRY and BORROW are not output from the predecoder). In this case, since the five-bit input address bit string (AC4, AC3, AC2, AC1, AC0)=(00100) and INC=high, consequently, column addresses 4 and 5 should be simultaneously selected. This process is verified by using FIGS. 4 and 5. First, referring to FIG. 4, as the higher bits are predecoded, BY8 is selected in correspondence to AC4, and BY5 is selected in correspondence to AC2 and AC3. At the moment, according to FIG.

5, connection is made to the block 202 through the contacts 120 and 122. Then, since the predecoder outputs BY0, BY1, CARRYN=high, and BORROWN=high with the lower two bits of the input address, the following situation is produced.

(1) Connection to the block 202 is performed through the contact 211. Accordingly, the lines 48, 50, 51, 52, 53, and 55 are connected through the contacts 218, 219, 220, and 221.

(2) The lines 51 and 52 connected to the contacts 219 and 220, respectively, are connected to BY1 and BY2 through the contacts 146 and 147, respectively. Since the predecoder outputs only BY1 and not BY2, the line 52 is shut down, and the line 51 selects the bit line 5 through the contact 146.

(3) For the remaining lines 48, 50, 53, and 55, when CARRYN =high and BORROWN=high, the line 50 with the contact 130 is connected for the former, and the line 53 with the contact 131 is connected for the latter. The line 50 extends to the contact 145 with BY0 through the contacts 130 and 232. Since the predecoder outputs BY0, the contact 145 does not shut down the line 53 (69), and the bit line 4 is selected through the line 69. On the other hand, the line 53 extends to the contact 148 which is a contact with BY3 through the contacts 131 and 233. Since the predecoder does not output BY3, the line 53 is shut down at the contact 148.

(4) Therefore, under these conditions, the bit lines 4 and 5 would be simultaneously selected. Since this corresponds to the column addresses 4 and 5, according to this embodiment, it is verified that two addresses can be simultaneously selected.

Next, it is considered a case where an address and INC out of the range of the same block are designated in the predecoder. For example, it is considered the above-mentioned case 4 where (AC1, AC0)=(1, 1) and INC=high. In this case, the outputs of the predecoder are CARRY=high, BY0, and BY3, as described above. In this case, since the five-bit input address bit string is (00111) and INC=high, consequently, the column addresses 7 and 8 should be simultaneously selected. This process is verified by using FIGS. 4 and 5. First, referring to FIG. 4, predecoding of the higher bit causes BY8 to be selected in correspondence to AC4, and BY5 to be selected in correspondence to AC2 and AC3. At the moment, according to FIG. 5, they are connected to the block 202 through the contacts 120 and 122. Then, since the predecoder outputs BY0, BY3, CARRY= high, and BORROWN=high with the lower two bits of the input address, the following situation is produced.

(1) Connection to the block 202 is performed through the contact 211. Accordingly, the lines 48, 50, 51, 52, 53, and 55 are connected through the contacts 218, 219, 220, and 221.

(2) The lines 51 and 52 connected to the contacts 219 and 220, respectively, are connected to BY1 and BY2 through the contacts 146 and 147, respectively. Since the predecoder does not output BY1 and BY2, both the lines 51 and 52 are shut down.

(3) For the remaining lines 48, 50, 53, and 55, when CARRY=high and BORROWN=high, the line 55 with the contact 133 is connected for the former, and the line 53 with the contact 131 is connected for the latter. The line 55 extends to the contact 149 with BY0 through the contacts 133 and 234. Since the predecoder outputs BY0, the contact 149 does not shut down the line 55 (71), and the bit line 8 is selected through the line 71. On the other hand, the line 53 extends to the contact 148 which is a contact with BY3 through the contacts 131 and 233. Since the predecoder outputs BY3, the line 53 is connected to the line 70 through the contact 148, and the bit line 7 is selected.

(4) Therefore, under these conditions, the bit lines 7 and 8 would be simultaneously selected. Since this corresponds to the column addresses 7 and 8, the former belongs to the block 202, and the latter belongs to the block 203, according to this embodiment, it is verified that two addresses in different blocks can be simultaneously selected.

Next, it is considered the above-mentioned case 5 where (AC1, AC0)=(0, 0) and INCN=high. In this case, as described above, the predecoder outputs BY0 as the first output, and simultaneously outputs BORROW and BY3 as the second output. In this case, since the five-bit input address bit string is (00100) and INCN=high, consequently, the column addresses 3 and 4 should be simultaneously selected. This process is verified by using FIGS. 4 and 5. First, referring to FIG. 4, predecoding of the higher bit causes BY8 to be selected in correspondence to AC4, and BY5 to be selected in correspondence to AC2 and AC3. At the moment, referring to FIG. 5 they are connected to the block 202 through the contacts 120 and 122. Then, since the predecoder outputs BY0, BY3, CARRYN=high, and BORROW=high with the lower two bits of the input address, the following situation is produced.

(1) Connection to the block 202 is performed through the contact 211. Accordingly, the lines 48, 50, 51, 52, 53, and 55 are connected through the contacts 218, 219, 220, and 221.

(2) The lines 51 and 52 connected to the contacts 219 and 220, respectively, are connected to BY1 and BY2 through the contacts 146 and 147, respectively. Since the predecoder does not output BY1 and BY2, both the lines 51 and 52 are shut down.

(3) For the remaining lines 48, 50, 53, and 55, when CARRYN=high and BORROW=high, the line 50 with the contact 130 is connected for the former, and the line 48 with the contact 128 is connected for the latter. The line 50 extends to the contact 145 with BY0 through the contacts 130 and 232. Since the predecoder outputs BY0, the contact does not shut down the line 50 (69), and the bit line 4 is selected through the line 69. On the other hand, line 48 extends to the contact 144 which is a contact with BY3 through the contacts 128 and 231. Since the predecoder outputs BY3, the line 48 is connected to the line 68 through the contact 144, and the bit line 3 is selected.

(4) Therefore, under these conditions, the bit lines 3 and 4 would be simultaneously selected. Since this corresponds to the column addresses 3 and 4, the former belongs to the block 201, and the latter belongs to the block 202, according to this embodiment, it is verified that two addresses in different blocks can be simultaneously selected.

As described in the above, when the predecoder and the decoder according to the present invention are used, the input address and an adjacent column address larger or smaller than the input address by one can be selected as the first output and the second output, respectively. Although both INC and INCN are provided for the above-mentioned embodiment, provision of only one of them does not impair attainment of the object of the present invention.

According to the present invention, the following advantages can be expected.

(1) Since two or more data can be read in one cycle, it can be expected to significantly improve the data transfer rate in a DRAM system.

(2) It is possible to select any continuous column addresses across blocks.

(3) The relationship between two addresses to be selected can be freely set to be larger or smaller than the first address. If both the shift-up and shift-down signal lines are provided, either one can be freely selected.

(4) Since two data are fetched in one cycle, it can be expected to reduce power consumption.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A predecoder circuit connected to a decoder circuit, said decoder circuit designating a first address line and a second address line simultaneously in a plurality of address lines divided into a plurality of address blocks which are composed of a predetermined number of said plurality of address lines, said first address line identified by having a large bit string of address bits and said second address line being identified by having a small bit string of said address bits being input to said predecoder circuit, said address blocks being identified by having the largest number of said address bits, said predecoder circuit comprising:

a plurality of numbered output lines corresponding to a number of said small bit string, said output lines being input to said predecoder circuit;

a designating input for selecting between a first address and a second address based on the large or small bit string, said first and second addresses corresponding to said first address line and said second address line, respectively; and a shift-up signal for enabling a shift up to a higher address block when the selection is the large bit string at the time said second address is larger than said first address, which occurs whenever either:

(a) said first address is selected as having the large bit string in one of said address blocks, a first output line having the large bit string, a second output line having the small bit string and said shift-up signal are being activated, or (b) said first address is not selected as having the large bit string in one of said address blocks, a first output line numbered as corresponding to, the small bit string second output line having a number which is continuous to and larger than the number of said small bit string of said first output line are activated.

2. A predecoder circuit connected to a decoder circuit said decoder circuit designating a first address line and a second address line simultaneously in a plurality of address lines divided into a plurality of address blocks which are composed of a predetermined number of said plurality of address lines, said first address line identified by having a large bit string of address bits and said second address line being identified by having a small bit string of said address bits being input to said predecoder circuit, said address blocks being identified by having the largest number of bits of said address bits, said predecoder circuit comprising:

a plurality of numbered output lines corresponding to a number of said small bit string, said output lines being input to said predecoder circuit;

a designating input for selecting between a first address and a second address based on the large or small bit string, said first and second addresses corresponding to said first address line and said second address line, respectively; and a shift-down signal for enabling a shift down to a lower address block when the selection is the small bit string at the time said second address is smaller than said first address, which occurs whenever either:

(a) said first address is selected as having the small bit string in one of said address blocks, a first output line having the small bit strong, a second output line having the large bit string and said shift-down signal are being activated, or (b) said first address is not selected as having the small bit string in one of said address blocks, a first output line numbered as corresponding to the small bit string, and a second output line having a number which is being continuous to and smaller than the number of said small bit string of said first output line are activated.

3. A DRAM system having a predecoder circuit connected to a decoder circuit, said decoder circuit designating a first address line and a second address line simultaneously in a plurality of address lines divided into a plurality of address blocks which are composed of a predetermined number of said plurality of address lines, said first address line identified by having a large bit string of address bits and said second address line being identified by having a small bit string of said address bits being input to said predecoder circuit, and said address blocks being identified by having a larger number of said address bits, said predecoder circuit comprising:

a plurality of input lines inputting address output made by the predecoder circuit;

a first input line for representing shift up; and a plurality of address lines, which are selected to be a first address corresponding to said first address line if the first address line has the large bit string in a first address block, wherein a line extending from said first address block to a second address block is activated by said first input line for selecting said second address line corresponding to a second address having the small bit string being the smallest in said second address block, and said second address block resides continuous to and is higher than said first address block.

4. A DRAM system according to claim 3 which further includes a second input line complementary to said first input line, wherein when said first address is not the largest bit string in said first address block, said second input line activates address lines in the first address block.

5. A DRAM system according to claim 4 which further includes:

a memory cell array consisting of a DRAM cell array;

a row address decoder connected to said memory cell array; and a column address decoder means connected to said memory cell array.

6. A DRAM system having a predecoder circuit connected to a decoder circuit, said decoder circuit designating a first address line and a second address line simultaneously in a plurality of address lines divided into a plurality of address blocks which are composed of a predetermined number of said plurality of address lines, said first address line identified by having a large bit string of address bits and said second address line being identified by having a small bit string of said address bits being input to said predecoder circuit, and said address blocks being identified by having a larger number of bits of said address bits, said predecoder circuit comprising:

a plurality of input lines inputting address output made by the predecoder circuit;

a first input line for representing shift down; and a plurality of address lines which are selected to be a first address corresponding to said first address line if the first address line has the small bit string in a first address block, wherein a line extending from said first address block to a second address block is activated by said first input line for selecting said second address line corresponding to a second address having the large bit string being the largest in said second address block, and said second address block resides continuous to and is lower than said first address block.

7. A DRAM system according to claim 6 which further includes a second input line complementary to said first input line, wherein when said first address is not the smallest bit string in said first address block, said second input line activates address lines in the second address block.

8. A DRAM system according to claim 6 which further includes:

a memory cell array consisting of a DRAM cell array;

a row address decoder connected to said memory cell array; and a column address decoder connected to said memory cell array.

* * * * *